INVENTORS
BENJAMIN AGUSTA
NEIL D. LUBART

BY Harry M Weiss
ATTORNEY

United States Patent Office 3,524,113

Patented Aug. 11, 1970

3,524,113

COMPLEMENTARY PNP-NPN TRANSISTORS AND FABRICATION METHOD THEREFOR

Benjamin Agusta and Neil D. Lubart, Poughkeepsie, N.Y., assignors to International Business Machines Corporation, Armonk, N.Y., a corporation of New York Filed June 15, 1967, Ser. No. 646,245

Int. Cl. H01l *19/00*

U.S. Cl. 317—235 9 Claims

ABSTRACT OF THE DISCLOSURE

This disclosure is primarily directed to the fabrication and construction of complementary PNP-NPN semiconductor devices in a monolithic integrated form. The devices of this disclosure use an isolation-type diffused region to form at least an emitter region thereby permitting the formation of complementary devices with both emitters having a high injection efficiency.

BACKGROUND OF THE INVENTION

Field of the invention

This invention relates generally to semiconductor devices and their fabrication and, more particularly, to the formation and construction of complementary transistor devices in a single monolithic structure.

Description of the prior art

In the past, complementary transistor devices were fabricated in a single monolithic structure wherein the PNP device was a lateral type transistor and the NPN device was a planar type transistor. These complementary devices were made using a P-type diffusion that simultaneously formed the base region of the NPN device as well as the emitter and collector regions of the lateral PNP device. A major disadvantage of this prior construction and fabrication process was the poor injection efficiency provided by the emitter of the PNP device of the complementary transistor pair.

SUMMARY OF THE INVENTION

It is an object of this invention to provide an improved semiconductor structure and fabrication method therefor.

It is another object of this invention to provide improved complementary transistor device structures and fabrication methods therefor.

It is a further object of this invention to provide improved lateral transistor devices.

DESCRIPTION OF THE PREFERRED EMBODIMENTS

In accordance with one embodiment of this invention, a complementary transistor structure in a monolithic semiconductor integrated arrangement comprises a high resistivity substrate of one conductivity type. A pair of spaced low resistivity regions of the opposite conductivity type is located in one surface of the substrate. A region of the opposite conductivity type is located on the substrate and on the pair of spaced low resistivity regions and has a higher resistance than the resistivity of the pair of spaced low resistivity regions. Low resistivity isolation regions of the same conductivity type as the substrate are connected to the substrate and divide the region of the opposite conductivity type into at least two isolated regions with each one of the pair of spaced low resistivity regions of the opposite conductivity type located in each of the two isolated regions. A planar transistor device is located in one of the two isolated regions and a lateral transistor device is located in the other of the two isolated regions, the lateral transistor device having an emitter region of the same resistivity and conductivity as the low resistivity isolation regions.

In accordance with another embodiment of this invention, a method for fabricating a complementary transistor structure in a monolithic semiconductor integrated arrangement comprises the steps of diffusing into a surface of a substrate of one conductivity type at least two spaced low resistivity regions of the opposite conductivity type. A layer of the same conductivity type as the two spaced low resistivity regions is epitaxially grown on the substrate and on the two spaced low resistivity regions and has a higher resistance than the resistivity of the two spaced low resistivity regions. Regions of the same conductivity type as the substrate and having a higher impurity concentration than the substrate are diffused into the epitaxial layer to electrically isolate the epitaxial layer into at least two regions and simultaneously form at least an emitter region in one of the two isolated regions. Other active regions are diffused into the epitaxial region thereby completing the complementary transistor structure and applying contacts to the active regions of the complementary transistor structure.

The foregoing and other objects, features and advantages of the invention will be apparent from the following more particular description of the preferred embodiments of the invention, as illustrated in the accompanying drawings.

SPECIFICATION

Figure 1:
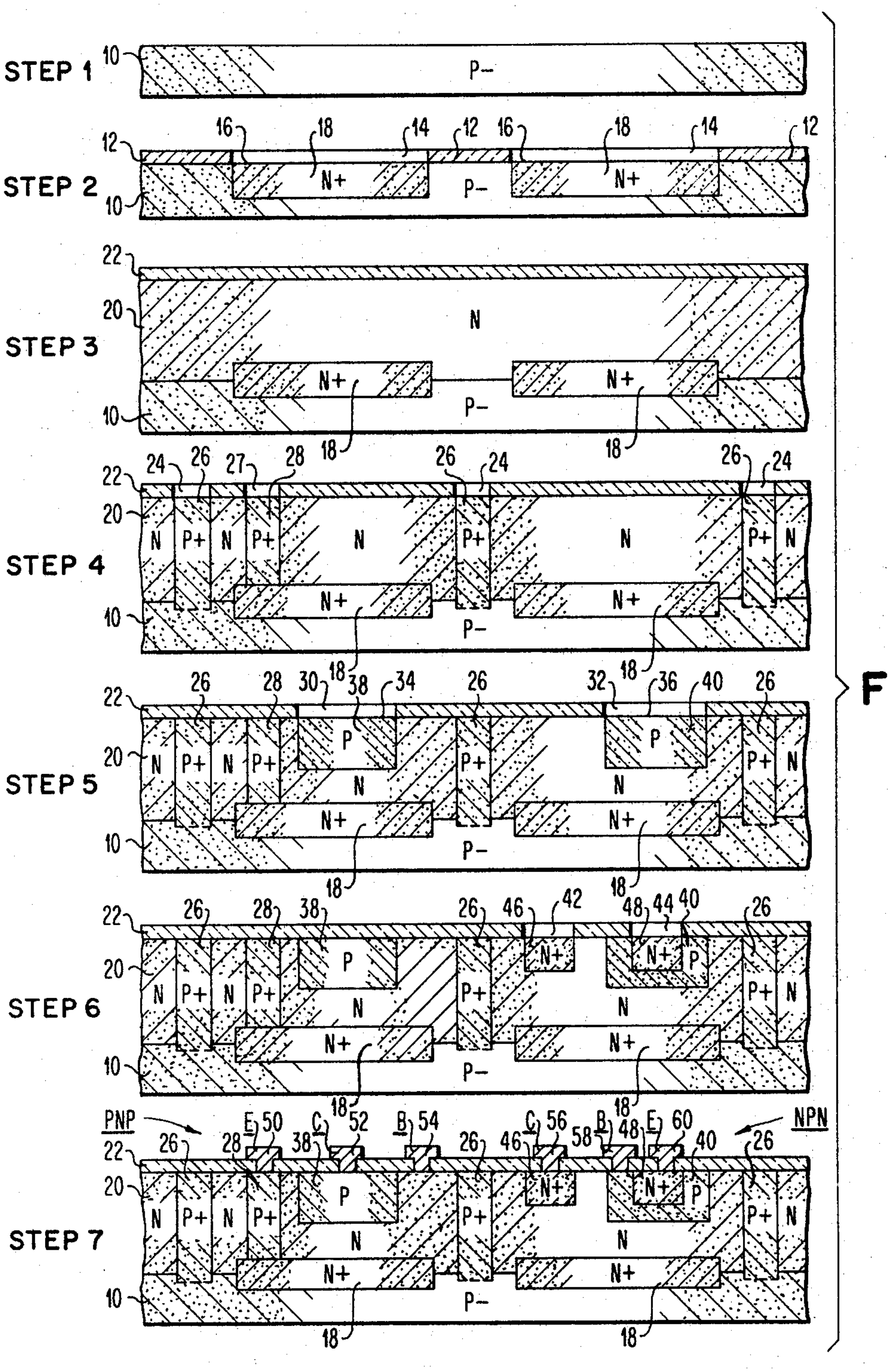
FIG. 1 illustrates, in cross-section, the steps in the process for fabricating a complementary transistor structure in accordance with one embodiment of this invention.

Referring to FIG. 1, step 1 depicts a substrate 10 of $P^-$ type conductivity, preferably having a resistivity of 10 to 20 ohms-centimeter and a thickness of about 10 mils. The substrate 10 is preferably a monocrystalline silicon structure which can be fabricated by conventional techniques such as by pulling a rod-shaped silicon semiconductor member from a melt containing the desired impurity concentration and then slicing the pulled member into a plurality of wafers. The subtrate 10 is a portion of one such wafer and preferably has a crystallographic orientation a few degrees off the <111> plane in the direction of the <110> plane.

In step 2, an oxide coating 12 preferably of silicon dioxide and preferably having a thickness of approximately 6000 angstrom units is either thermally grown or deposited by pyrolytic deposition. Alternatively, an RF sputtering technique, as described in a patent application identified as S.N. 428,733, filed Jan. 28, 1965, in the names of Davidse and Maissel and assigned to the same assignee as this invention, can be used to form the silicon dioxide layer 12. Following the formation of the oxide layer 12, holes 14 are formed in the oxide layer 12 using conventional photolithographic masking and etching techniques. In the photolithographic masking and etching operation, a photo-resist layer (not shown) is applied over the oxide layer 12 and by masking and developing techniques the holes 14 are formed by etching away the desired portion of the $SiO_2$ layer 12 with a buffered HF solution. The photoresist layer is then removed to permit further processing. A diffusion operation is carried out to diffuse into the exposed surfaces 16 of the subtrate 10 $N^+$ regions 18 having a $C_0$ of $2\times10^{20}$ cm.$^{-3}$ of N type majority carriers. The sheet resistance of the $N^+$ regions 18 is approximately 9.0 ohms per square, and the depth of the diffused region is approximately 90 microinches. The oxide layer 12 serves as a mask to prevent an $N^+$ skin region from being formed across the entire surface of the surbstrate 10. Preferably, the $N^+$ diffusion operation is carried out in an evacuated quartz capsule using degenerate arsenic doped silicon powder. As an alternative variation, the $N^+$ regions 18 can be formed by etching out two areas in the $P^-$ type substrate 10 and then subsequently epitaxially growing the two $N^+$ regions 18.

In step 3, after removing the oxide layer 12 with a buffered HF solution, a region 20 of N type conductivity, preferably having a resistivity of 0.09 ohm per centimeter, is epitaxially grown on the surface of the substrate. The epitaxial region 20 is an arsenic doped layer approximately 5.5+.2 microns thicks. In actual device fabrication, the arsenic impurities in the two $N^+$ regions 18, which are now buried, outdiffuse about one micron during the epitaxial deposition operation. An oxide layer 22 approximately 4000 angstrom units thick is formed on the surface of the epitaxially grown region 20 either by the thermal oxidation process, by pyrolytic deposition, or by RF sputtering techniques.

In step 4, a continuous pattern of openings 24 is formed in the oxide layer 22 by standard photolithographic masking and etching techniques using a photoresist layer as a mask and a buffered RF solution to remove the desired oxide portions. In addition to the continuous pattern of openings 24, an additional opening 27, preferably having parallel sides such as a square or rectangular configuration, is formed in the oxide layer 22 (left side portion of step 4). The structure is now prepared for the subsequent isolation type diffusion operation. A $P^+$ diffusion is now carried out, preferably using a boron source, to form surrounding or isolation $P^+$ regions 26 in the N type epitaxially grown region 20. In addition, the $P^+$ diffusion operation also forms $P^+$ region 28 below opening 27 in the oxide layer 22. The $P^+$ regions 26 and 28 have a $C_0$ (surface concentration) of $2.2\times10^{20}$ cm$^{-3}$ and a sheet resistance of about 2.5 ohms per square. The $P^+$ diffused region 28 extends into contact with the buried $N^+$ region 18 which serves to prevent possible shorting between P-type regions 10 and 28. The $P^+$ region 28 subsequently serves as the emitter region of a PNP transistor device. The depth of the $P^+$ regions 26 and 28 is approximately 300 microinches.

In step 5, a reoxidation operation is carried out and by using photolithographic masking and etching techniques, two holes 30 and 32 are opened up in the oxide layer 22 above the isolated epitaxially grown N type regions 20 so as to permit a P-type diffusion. A P-type diffusion operation is carried out through semiconductor surface portions 34 and 36 to form both a P-type collector region 38 beneath the opening 30 in the oxide layer 22 and a P-type base region 40 beneath the opening 32 in the oxide layer 22. Boron is preferably used as the impurity source to form the P-type regions 38 and 40 with each region having a $C_0$ of $1\times10^{19}$ atoms per cm.$^{-3}$, a sheet resistance of about 150 ohms per square, and a depth of about 80 microinches.

In step 6, the P-type diffusion operation is followed by a simultaneous reoxidation and drive-in operation. $SiO_2$ is thereby grown on the substrate surface. During this heat treatment, the boron impurities are redistributed thereby increasing the junction depth and lowering the $C_0$.

A photoresist coating is applied over the oxide layer 22 and by photolithographic masking and etching operations two portions 42 and 44 of this oxide layer are removed to permit $N^+$ or emitter type regions to be formed by a diffusion operation. Two $N^+$ emitter type regions 46 and 48 are formed in the N type collector region 20, respectively, beneath the openings 42 and 44. The $N^+$ region 46 provides a good electrical contact region to the N-type collector 20. The $N^+$ emitter region 48 is formed in the P-type base region 40 simultaneous with the formation of the $N^+$ region 46.

The $N^+$ regions 46 and 48 are preferably formed using a phosphorous impurity source. The $C_0$ of the $N^+$ regions 46 and 48 is preferably $2.5\times10^{21}$, the sheet resistance is about 8 ohms per square, and the depth is approximately 71 microinches. Hence, the base channel width between the $N^+$ emitter region 48 and the N collector region 20 is approximately 17 microinches due to "push out" of the base region after formation of the diffused emitter region. The emitter and base regions are formed over the buried $N^+$ region to permit this region to act as a buried low resistivity sub-collector.

In step 7, an emitter drive-in and reoxidation operation is performed thereby forming additional $SiO_2$ on the substrate surface. Holes are opened up in the oxide layer 22 in selected areas thereof by using photolithographic masking and etching techniques. A layer of aluminum or other suitable metal such as molybdenum is evaporated over the entire wafer surface and portions of this layer are etched away to produce the desired interconnection pattern. The evaporated layer of aluminum has a thickness of several thousand Angstrom units. A layer of photoresist is then applied to the wafer, dried, exposed, developed, and fixed. The aluminum interconnections are formed by a subtractive etching operation using a warm solution of $H_3PO_4+HNO_3+H_2O$. The photoresist layer is stripped off and the wafer is cleaned and dried.

The wafers are sintered in a nitrogen atmosphere at a temperature of about 450° C. for a period of about 15 minutes to permit the aluminum to produce good ohmic contact to the contacted semiconductor regions of the wafer. Thus, ohmic contacts 50, 52 and 54 provide electrical connection to the emitter 28, collector 38 and base 20 regions of the PNP lateral transistor device shown on the left side portion of the monolithic structure of step 7. Ohmic contacts 56, 58, and 60 provide electrical connection to the collector 20, base 40, and emitter 48 regions of the NPN planar transistor shown on the right side portion of the monolithic structure of step 7.

Figure 2:
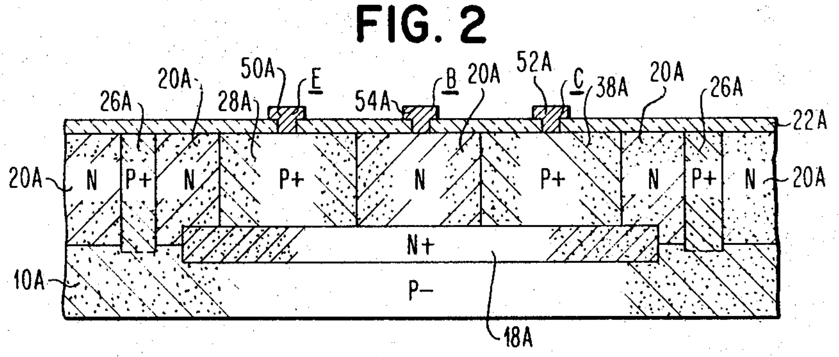
FIG. 2 is a cross-sectional view of a lateral transistor device in accordance with another embodiment of this invention.

Referring to FIG. 2, another embodiment is shown of a lateral PNP transistor device which can be fabricated substantially in accordance with the process shown in steps 1 to 7 of FIG. 1. The same reference numbers used to designate the similar elements of the PNP lateral transistor device of step 7 of FIG. 1 are used for the PNP device of FIG. 2 with the addition of the letter A. In the process for fabricating the lateral PNP transistor device of FIG. 2, the collector region 38A is formed at the same time as the emitter region 28A is made. This is achieved by opening up a hole in the oxide layer above the region 38A and carrying out the $P^+$ isolation type diffusion operation. In this manner, a PNP lateral transistor device is formed having a symmetrical configuration which enables interchange, if desired, between the emitter and collector regions thereby enabling each of these regions to serve as either the emitter or collector regions. Additionally, both the emitter 28A and collector 38A regions are of $P^+$ type conductivity thereby insuring a high emitter injection efficiency regardless of which region is selected as the emitter. The lateral distance across the N-type base region 20A between the emitter 28A and collector 38A regions determines the base width. The $N^+$ subcollector region 18A can be interrupted between emitter and collector interfaces.

Figure 3:
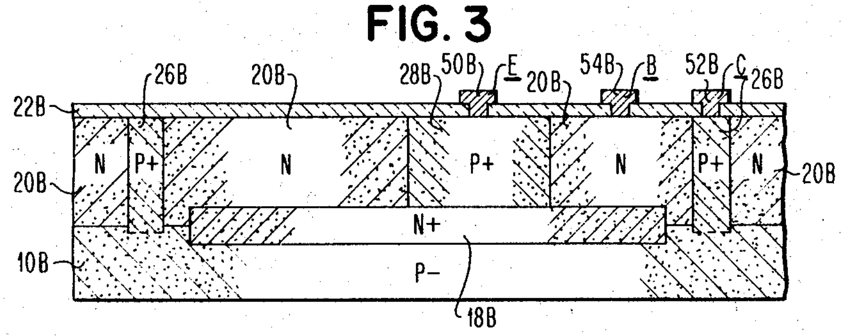
FIG. 3 is a cross-sectional view of a lateral transistor device in accordance with still another embodiment of this invention.

Referring to FIG. 3, still another embodiment is shown of a lateral PNP transistor device which can also be fabricated substantially in accordance with the process shown in steps 1 to 7 of FIG. 1. The same reference numbers used to designate the similar elements or regions of the PNP lateral transistor device of step 7 of FIG. 1 are used for the PNP device of FIG. 3 with the addition of the letter B. In the process for fabricating the lateral PNP transistor device of FIG. 3, the collector is now the P+ isolation type region 26B and there is no additional diffused P-type region needed to provide a collector. This configuration has application in situations where a grounded collector is used.

Figure 4:
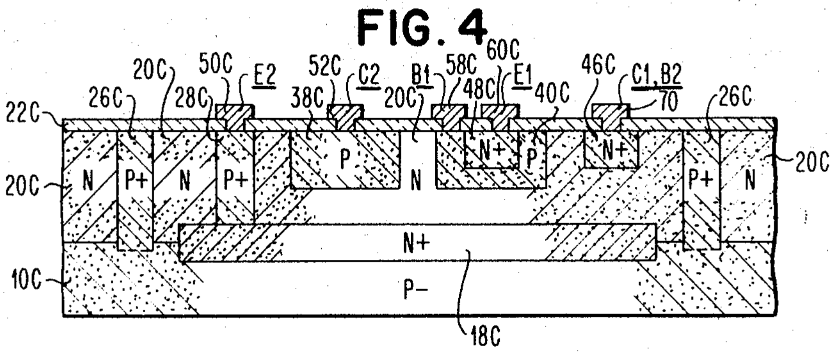
FIG. 4 is a cross-sectional view of a complementary transistor structure in accordance with a further embodiment of this invention.
Figure 5:
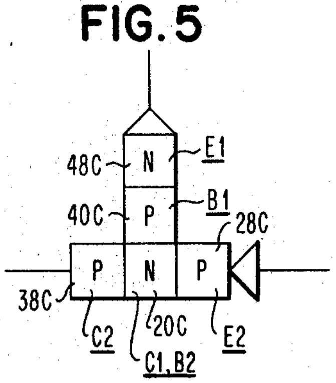
FIG. 5 is an electrical schematic representation of the complementary transistor structure of FIG. 4.

Referring to FIG. 4, a combined complementary pair of PNP and NPN transistor devices are shown. The same reference numbers used to designate the similar elements or regions of the complementary NPN and PNP transistor devices of step 7 of FIG. 1 are used for the combined complementary pair of PNP and NPN devices of FIG. 4 with the addition of the letter C. FIG. 5 illustrates the electrical schematic representation of the combined PNP-NPN device of FIG. 4. N-type region 20C of FIG. 4 functions as both the N-type collector of the NPN transistor device portion as well as the N-type base region of the PNP transistor device portion of FIG. 4. Hence, only one ohmic contact 70 is provided for electrical contact to the N-type region 20C. The ohmic contact 70 is in electrical contact with N+ diffused region 46C. The combined NPN-PNP device of FIG. 4 is made substantially the same as the electrically isolated NPN-PNP devices shown in step 7 of FIG. 1 with the major difference being that the NPN-PNP device of FIG. 4 is formed in a single isolated N-type region. This five terminal combined PNP-NPN device provides two stages of gain with signal phase advantages.

In discussing the semiconductor fabrication method, reference is made to a semiconductor configuration wherein P− type region is utilized as the substrate and subsequent semiconductor regions of the composite semiconductor structures are formed in the conductivity type described. It is readily apparent that the same regions that are referred to as being of one conductivity type can be the opposite type conductivity and furthermore, some of the operations which are described as diffusion operations can be made by epitaxial growth and some of the epitaxial growth regions can also be fabricated by diffusion techniques.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A complementary transistor structure in a monolithic semiconductor integrated arrangement comprising, in combination, a high resistivity substrate of one conductivity type;

- a pair of spaced low resistivity regions of the opposite conductivity type located in one surface of said substrate;
- a region of said opposite conductivity type located on said substrate and on said pair of spaced low resistivity regions and having a higher resistance than the resistivity of said pair of spaced low resistivity regions;
- low resistivity isolation regions of the same conductivity type as said substrate connected to said substrate and dividing said region of said opposite conductivity type into at least two isolated regions with each one of said pair of spaced low resistivity regions of the opposite conductivity type located in each of said two isolated regions;
- a planar transistor device located in one of said two isolated regions; and
- a lateral transistor device located in the other of said two isolated regions, said lateral transistor device having an emitter region of the same resistivity and conductivity as said low resistivity isolation regions.

2. A complementary transistor structure in accordance with claim 1, wherein said emitter region of said lateral transistor device being in contact with and extendig upwardly from one of said pair of spaced low resistivity regions of the opposite conductivity type.

3. A complementary transistor structure in accordance with claim 2, wherein said lateral transistor being a PNP device and said planar transistor being a NPN device.

4. In a monolithic integrated semiconductor structure, a lateral transistor device comprising:

- a high resistivity substrate of one conductivity type;
- a low resistivity region of the opposite conductivity type having a high impurity concentration of the opposite conductivity type located on said substrate;
- an emitter region of the same conductivity type as said substrate and having a high impurity concentration, said emitter region being in contact with said low resistivity region and extending upwardly therefrom, and said low resistivity region isolating said emitter region from said substrate;
- a base region and a collector region laterally disposed with respect to said emitter region; and
- ohmic contacts to said emitter, base, and collector regions.

5. The device of claim 4, wherein said emitter region being of P-type conductivity, said base region being of N-type conductivity, and said collector region being of P-type conductivity.

6. The device of claim 4, wherein said collector region having the same impurity concentration as said emitter reigon.

7. The device of claim 6, wherein said collector region being in contact with said low resistivity region and extending upwardly therefrom.

8. The device of claim 4 wherein said base region is in contact with said low resistivity region and extends upwardly therefrom.

9. The device of claim 8 wherein said collector region is in contact with said low resistivity region and extends upwardly therefrom.

References Cited

UNITED STATES PATENTS

| | | | |
|---|---|---|---|
| 3,370,995 | 2/1968 | Lowery | 317—235 X |
| 3,423,653 | 1/1969 | Chang | 317—235 |
| 3,177,414 | 4/1965 | Kurosawa et al. | 317—235 |
| 3,221,215 | 11/1965 | Osafune et al. | 317—101 |
| 3,260,902 | 7/1966 | Porter | 317—235 |
| 3,380,153 | 4/1968 | Husher et al. | 317—235 X |
| 3,327,182 | 6/1967 | Kisinko | 317—235 |

JAMES D. KALLAM, Primary Examiner

U.S. Cl. X.R.

317—234